(12) United States Patent
Chen (10) Patent No.: US 10,645,826 B1
(45) Date of Patent: May 5, 2020

(54) ELASTIC CLAMPING FASTENER MODULE OF INDUSTRIAL CABINET RAIL

(71) Applicant: MARTAS PRECISION SLIDE CO., LTD., New Taipei (TW)

(72) Inventor: Wan-Lai Chen, New Taipei (TW)

(73) Assignee: MARTAS PRECISION SLIDE CO., LTD., New Taipei (TW)

(*) Notice: Subject to any disclaimer, the term of this patent is extended or adjusted under 35 U.S.C. 154(b) by 0 days.

(21) Appl. No.: 16/519,009

(22) Filed: Jul. 23, 2019

(51) Int. Cl.
| | |
|---|---|
| H05K 7/14 | (2006.01) |
| A47B 88/00 | (2017.01) |
| H05K 5/02 | (2006.01) |
| A47B 88/43 | (2017.01) |
| A47B 88/423 | (2017.01) |
| A47B 57/48 | (2006.01) |

(52) U.S. Cl.
CPC ........... H05K 5/0208 (2013.01); A47B 88/43 (2017.01); H05K 7/1489 (2013.01); A47B 57/48 (2013.01); A47B 88/423 (2017.01)

(58) Field of Classification Search
CPC .. H05K 5/0208; H05K 7/1489; H05K 7/1421; H05K 7/183; A47B 88/43; A47B 88/423
See application file for complete search history.

(56) References Cited

U.S. PATENT DOCUMENTS

| | | | | |
|---|---|---|---|---|
| 8,870,311 | B2* | 10/2014 | Chang | H05K 7/1489 312/334.4 |
| 9,363,921 | B1* | 6/2016 | Chen | H05K 7/1489 |
| 9,532,483 | B1* | 12/2016 | Chang | F16B 2/12 |
| 9,723,924 | B1* | 8/2017 | Chiu | A47B 88/43 |
| 10,070,555 | B1* | 9/2018 | Chen | H05K 7/1489 |
| 10,420,420 | B2* | 9/2019 | Chen | A47B 88/43 |
| 2009/0250421 | A1* | 10/2009 | Wang | G06F 1/183 211/183 |
| 2014/0117180 | A1* | 5/2014 | Chen | H05K 7/1489 248/219.1 |
| 2014/0363109 | A1* | 12/2014 | Chen | A47B 88/43 384/22 |
| 2015/0048041 | A1* | 2/2015 | Chuang | H05K 7/1489 211/175 |
| 2016/0309607 | A1* | 10/2016 | Hsu | H05K 7/1489 |
| 2017/0055707 | A1* | 3/2017 | Chen | A47B 88/407 |
| 2017/0354055 | A1* | 12/2017 | Hsu | H05K 7/1489 |
| 2018/0199712 | A1* | 7/2018 | Chen | A47B 88/43 |
| 2018/0220797 | A1* | 8/2018 | Chen | A47B 88/423 |
| 2019/0104846 | A1* | 4/2019 | Chen | A47B 88/43 |

* cited by examiner

Primary Examiner — Kimberley S Wright
(74) Attorney, Agent, or Firm — Fei-hung Yang (57) ABSTRACT

An elastic clamping fastener module of an industrial cabinet rail includes a fixed seat, an engaging plate, a chassis fixing block, a pair of first elastic elements, a fixing block cover and a second elastic element. The chassis fixing block is covered by the fixing block cover, fixed to the fixed seat, and connected to the fixing block cover through the first elastic elements. The fixing block cover is connected to the fixed seat through the second elastic element. The chassis fixing block passes into the corresponding buckle hole of the chassis to fix the slide rail between the two chassis, the chassis fixing block, fixing block cover and engaging plate elastically clamp and fix both sides of the chassis to improve fixation stability.

8 Claims, 7 Drawing Sheets

Fig. 7

US 10,645,826 B1

ELASTIC CLAMPING FASTENER MODULE OF INDUSTRIAL CABINET RAIL

BACKGROUND

Technical Field

The present disclosure generally relates to the field of industrial computer cabinets. More particularly, the present disclosure relates to an elastic clamping fastener module of an industrial cabinet rail which is convenient to assemble and can be fixed to both sides of a chassis in an elastic clamping manner during installation, so as to improve installation stability.

Description of Related Art

In general, an industrial computer is installed horizontally in an industrial cabinet, and a chassis is installed vertically to each of the four corners of the industrial cabinet, and a relative surface of each chassis has a plurality of fixing holes or screw holes formed vertically thereon and spaced from each other, and fixed by a fixing block or a fixing screw, so that the industrial computers can be stacked vertically in the industrial cabinet.

Since it is necessary to remove the industrial computers from the industrial cabinet for maintenance and repair, and this inconvenient method using the fixing block or fixing screw for the fixation takes much effort for the removal, therefore a pull-out type slide rail is provided to replace the traditional fixing block or fixing screw for installation. The pull-out type slide rail has the pull-stretching and stack-retracting features, and the slide rails of different lengths can overcome the issue of insufficient space by a two-stage or three-stage design and also can push the industrial computers into the industrial cabinet or pull the industrial computers selectively out from the industrial cabinet for expansion, replacement, inspection, or maintenance and repair, so as to improve the convenience of future maintenance. Traditionally, the fixing screw is used to fix the slide rail into the industrial cabinet, and the removal and reinstallation are very troublesome.

In recent years, various types of fixing fastener modules are introduced to overcome the problem of the convenient removal, and these fixing fastener modules are installed at both ends of the slide rail, and the fixing fastener module has a fixing pillar disposed on a surface of the fixing fastener module and passing into the fixing holes of the chassis, and the weight of the industrial computers can keep the slide rail to be fixed between the chassis, so as to omit complicated procedure for the installation or removal. In this pressing method by using the weight of the industrial computers, the industrial computers may have violent vibration or topple over. Therefore, the industrial computers may fall out or may even be damaged easily, and screws are added for auxiliary fixation to improve the installation stability. However, such arrangement results in an inconvenient removal.

In view of the aforementioned drawbacks of the prior art, manufacturers have designed and developed a fixing and engaging module with an automatic locking function in recent years, and provided a special hook design capable of locking the fixing and engaging module onto the chassis automatically after the installation without requiring additional screws for the fixation. In practical operations, the structural design of such fixing and engaging module has the issue of being loosened easily by wrong operations or misuses. Obviously, the conventional fixing and engaging module requires further improvements.

SUMMARY

Therefore, it is a primary objective of the present disclosure to provide an elastic clamping fastener module of an industrial cabinet rail, wherein a slide rail is fixed in an industrial cabinet quickly by using a pair of first elastic elements and a second elastic element to provide resilience while a chassis fixing block and a fixing block cover are telescoping, and an engaging plate is provided for elastically clamping and fixing both sides of a chassis of the industrial cabinet to achieve the effect of improving fixation stability.

To achieve the aforementioned and other objectives, the present disclosure discloses an elastic clamping fastener module of an industrial cabinet rail, characterized in that a chassis is disposed at each of the four corners of the industrial cabinet, and each vertically erected chassis has a plurality of buckle holes disposed apart from each other, and the elastic clamping fastener module is installed at a front end of the slide rail, configured to be opposite to the industrial cabinet, and provided for installing the slide rail horizontally between the two chassis, and the elastic clamping fastener module comprises: a fixed seat, having a first receiving slot formed on a side of the fixed seat and configured to be corresponsive to the slide rail, a second receiving slot formed on the other side of the fixed seat, a stop plate disposed on a side of the second receiving slot and configured to be corresponsive to the chassis, two through holes formed on the stop plate and arranged side by side with an interval apart from each other, and a first fixing hook disposed in the second receiving slot; an engaging plate, having a section fixed to a reverse side of the fixed seat and configured to be opposite to the second receiving slot, a hook extending outwardly from the other side of the engaging plate, and an engaging slot formed on a surface of the outwardly extended section and configured to be corresponsive to the stop plate; a chassis fixing block, movably installed into the second receiving slot, and having two bumps formed on the chassis fixing block and configured to be corresponsive to the pair through holes for passing and fixing into any two of the buckle holes of the chassis respectively; a pair of first elastic elements, with an end disposed on a side of the chassis fixing block, such that the two bumps pass out from the two through holes respectively; a fixing block cover, with a side movably installed into the second receiving slot through a pair of pivots, and the fixing block cover being provided for covering the chassis fixing block and the two first elastic elements, so that the chassis fixing block can restrict a linear movement inside the fixing block cover, and the fixing block cover having a second fixing hook disposed at an edge of the fixing block cover and configured to be opposite to the pair of pivots; and a second elastic element, with both ends disposed between the first fixing hook and the second fixing hook, for ensuring that the fixing block cover abuts against the chassis; thereby, during installation, the engaging slot of the engaging plate is used for engaging by the front side of the chassis, and then the second elastic element is used to keep the fixing block cover abutting the reverse side of the chassis, and the chassis fixing block is pushed by the first elastic element to pass into the buckle holes corresponding to the chassis, and then the slide rail is fixed between the two chassis.

In an embodiment, the fixing block cover has two press plates corresponding to the chassis fixing block for reducing vibration produced by the movement of the chassis fixing block. The chassis fixing block has a pair of limit blocks disposed with an interval apart on the top of the chassis fixing block, and a pair of first limit grooves formed on a surface of the fixing block cover corresponding to the pair of limit blocks, and during installation, the pair of limit blocks are respectively and movably installed in the pair of first limit grooves. In addition, each bump at the front end of the chassis fixing block is in a shape corresponding to that of the buckle hole and designed with a two-stage structure in form of a rectangular shape combined with a cylindrical shape, and provided for corresponding to the design of fixing the buckle hole which is in a circular shape or a square shape. Further, the fixing block cover has two second limit grooves configured to be corresponsive to the pair of pivots respectively, so that after the pair of pivots pass into the two second limit grooves respectively, the fixing block cover is also in a movement limit mode. Further, the second receiving slots have two fixing holes formed at the center thereof respectively and provided for fixing the engaging plate to the other side of the fixed seat, and the stop plate has a positioning hole formed at the center thereof, and the fixing block cover has a positioning protrusion configured to be corresponsive to the positioning hole and the positioning hole is disposed between the two through holes, and after installation, the positioning protrusion is disposed in the positioning hole. The aforementioned structure of this disclosure can improve the stability of movements.

In another embodiment, the fixing block cover has a pair of mounting columns configured to be corresponsive to the pair of first elastic elements and provided for sheathing an end of each of the first elastic elements on each of the mounting columns respectively.

BRIEF DESCRIPTION OF THE DRAWINGS

The accompanying drawings are included to provide a further understanding of the disclosure, and are incorporated in and constitute a part of this specification. The drawings illustrate embodiments of the disclosure, and together with the description, serve to explain the principles of the disclosure.

DESCRIPTION OF THE EMBODIMENTS

Reference will now be made in detail to the present embodiments of the disclosure, examples of which are illustrated in the accompanying drawings. Wherever possible, the same reference numbers are used in the drawings and the description to refer to the same or like parts.

With reference to FIGS. 1, 2, 3 and 4 to 7 for an exploded view and a perspective view of a preferred embodiment and an exploded view of another preferred embodiment and schematic views showing continuous operating status of a preferred embodiment of this disclosure respectively, an elastic clamping fastener module 1 is mounted onto a slide rail 3 of an industrial cabinet 2, wherein a chassis 21 is disposed at each of the four corners of the industrial cabinet 2, and each vertically erected chassis 21 has a plurality of buckle holes 211 formed with an interval apart from each other thereon, and the elastic clamping fastener module 1 is installed at a front end of the slide rail 3, configured to be opposite to the industrial cabinet 2, and provided for installing the slide rail 3 horizontally between the two chassis 21, and the elastic clamping fastener module 1 comprises a fixed seat 11, an engaging plate 12, a chassis fixing block 13, a pair of first elastic elements 14, a fixing block cover 15 and a second elastic element 16.

Figure 1:
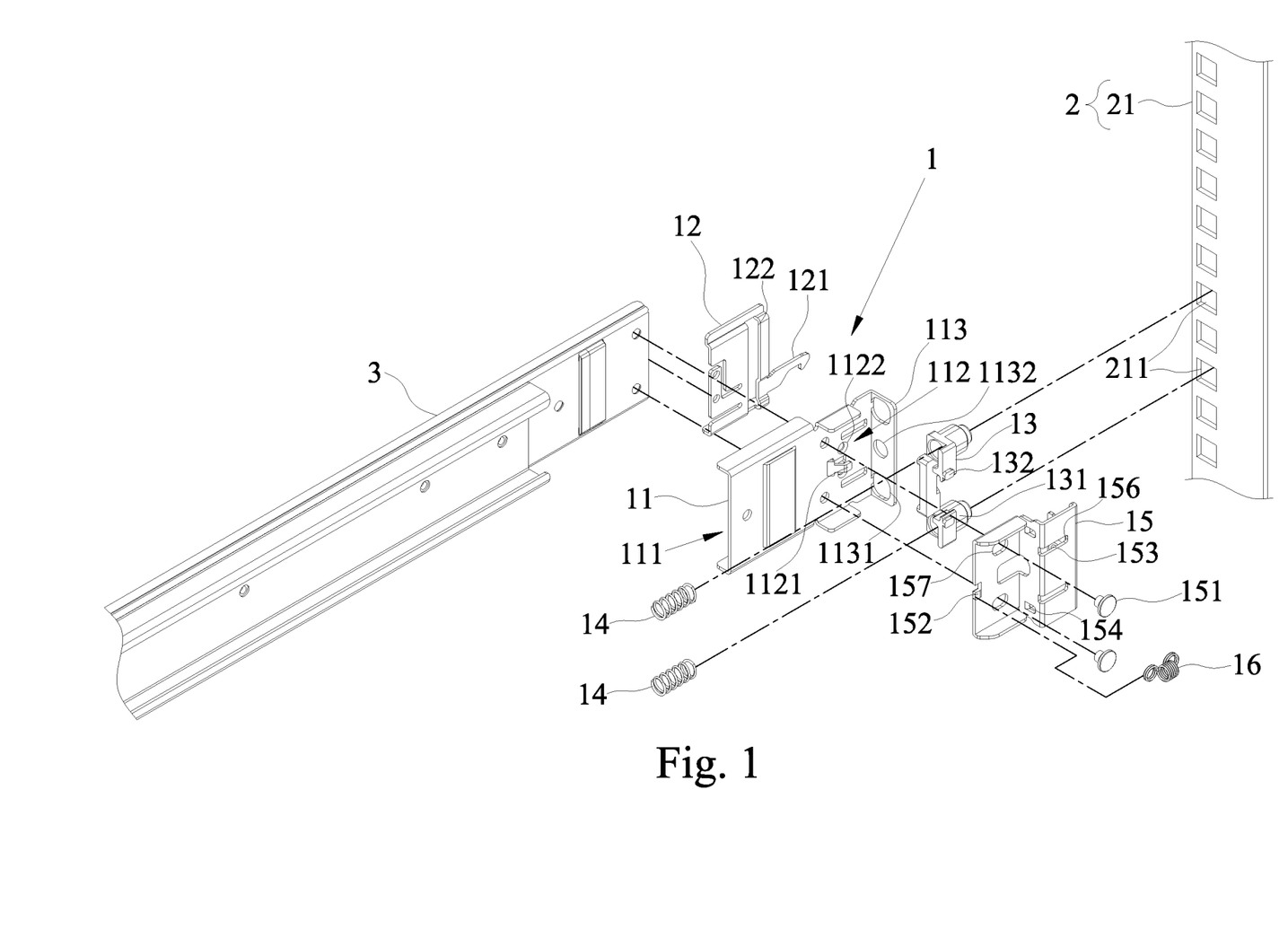
FIG. 1 is an exploded view of an insole of a preferred embodiment of this disclosure.
Figure 2:
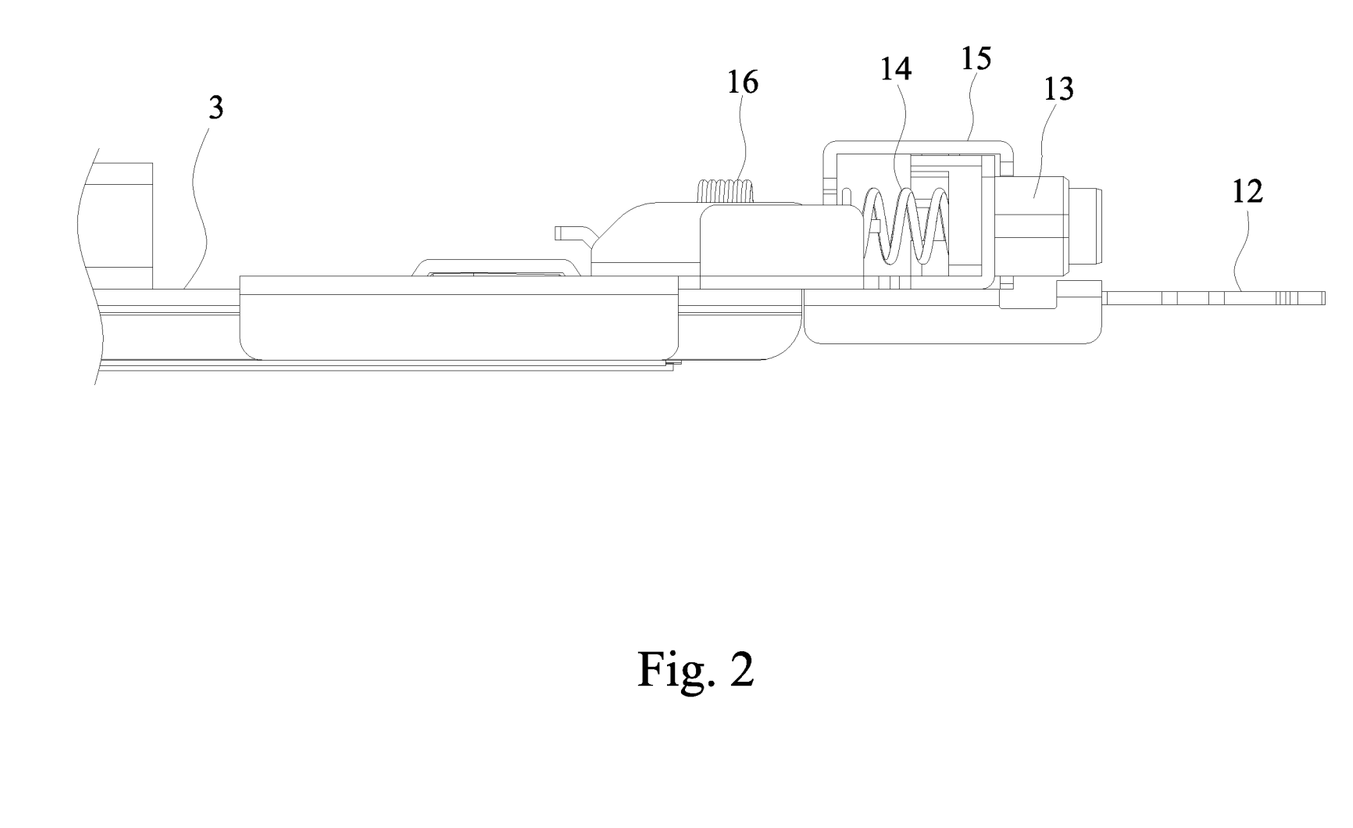
FIG. 2 is a perspective view of an assembled structure of a preferred embodiment of this disclosure.
Figure 3:
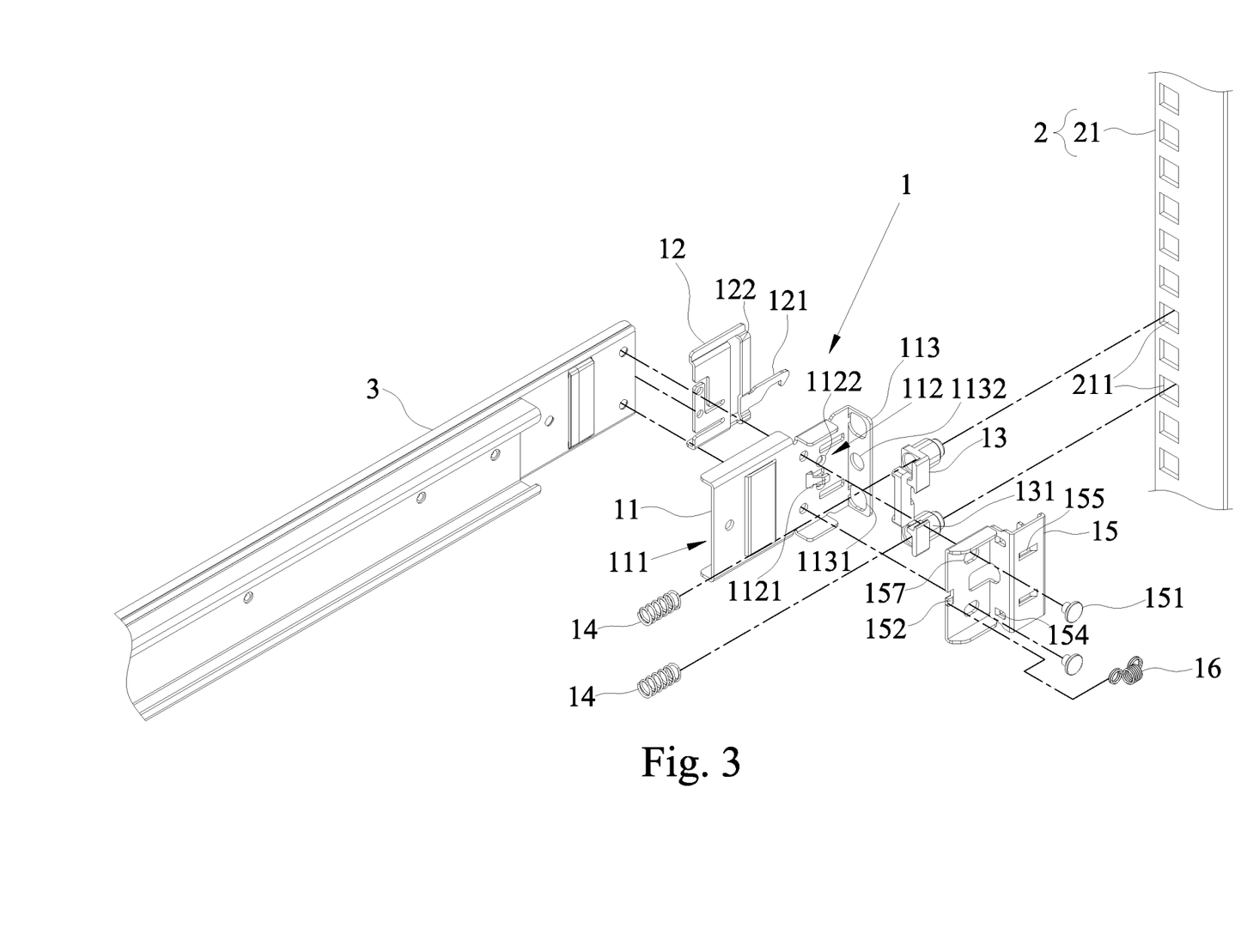
FIG. 3 is another exploded view of an insole of a preferred embodiment of this disclosure.
Figure 4:
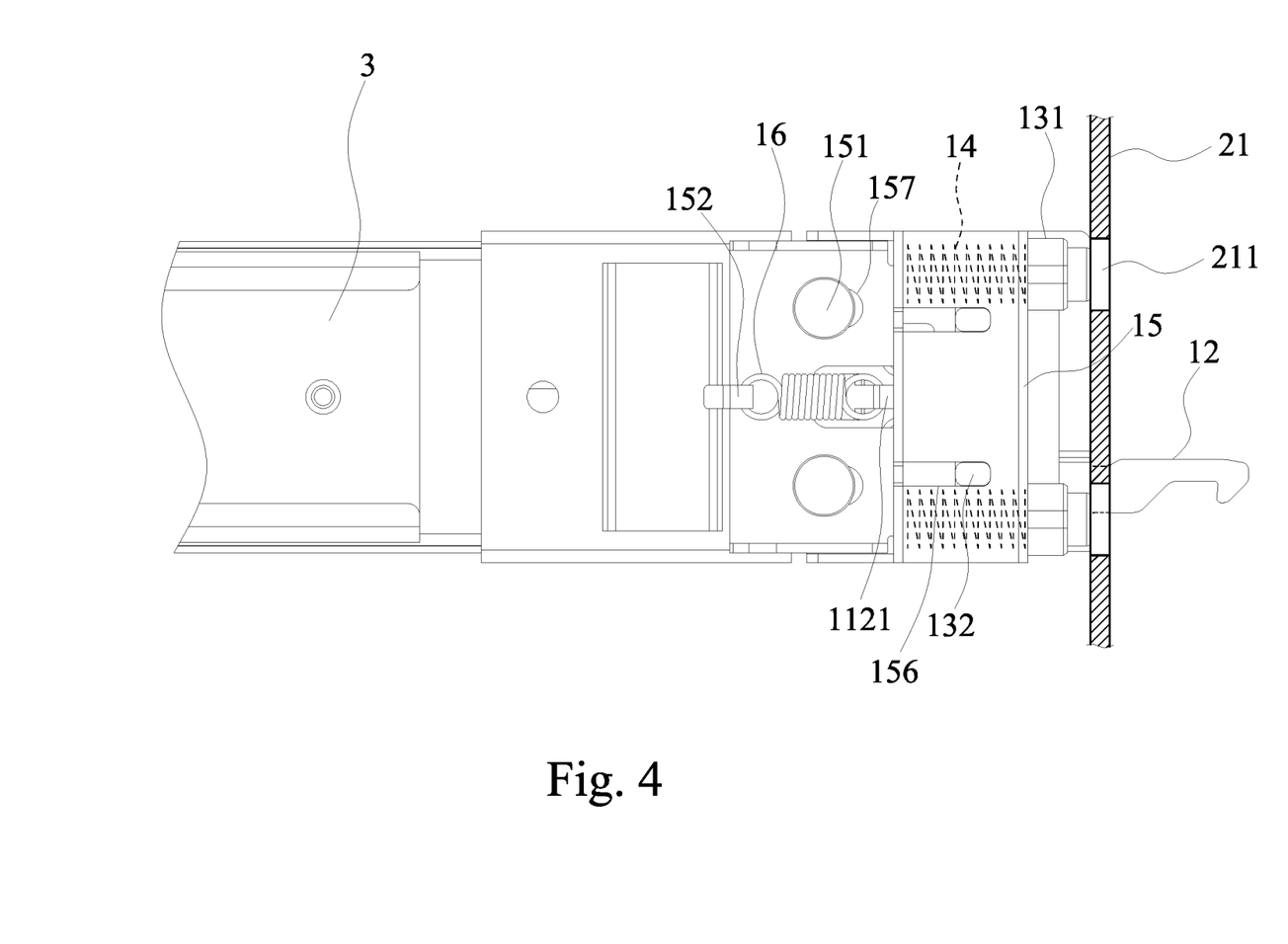
FIG. 4 is a first schematic view showing an operating status of a preferred embodiment of this disclosure.
Figure 5:
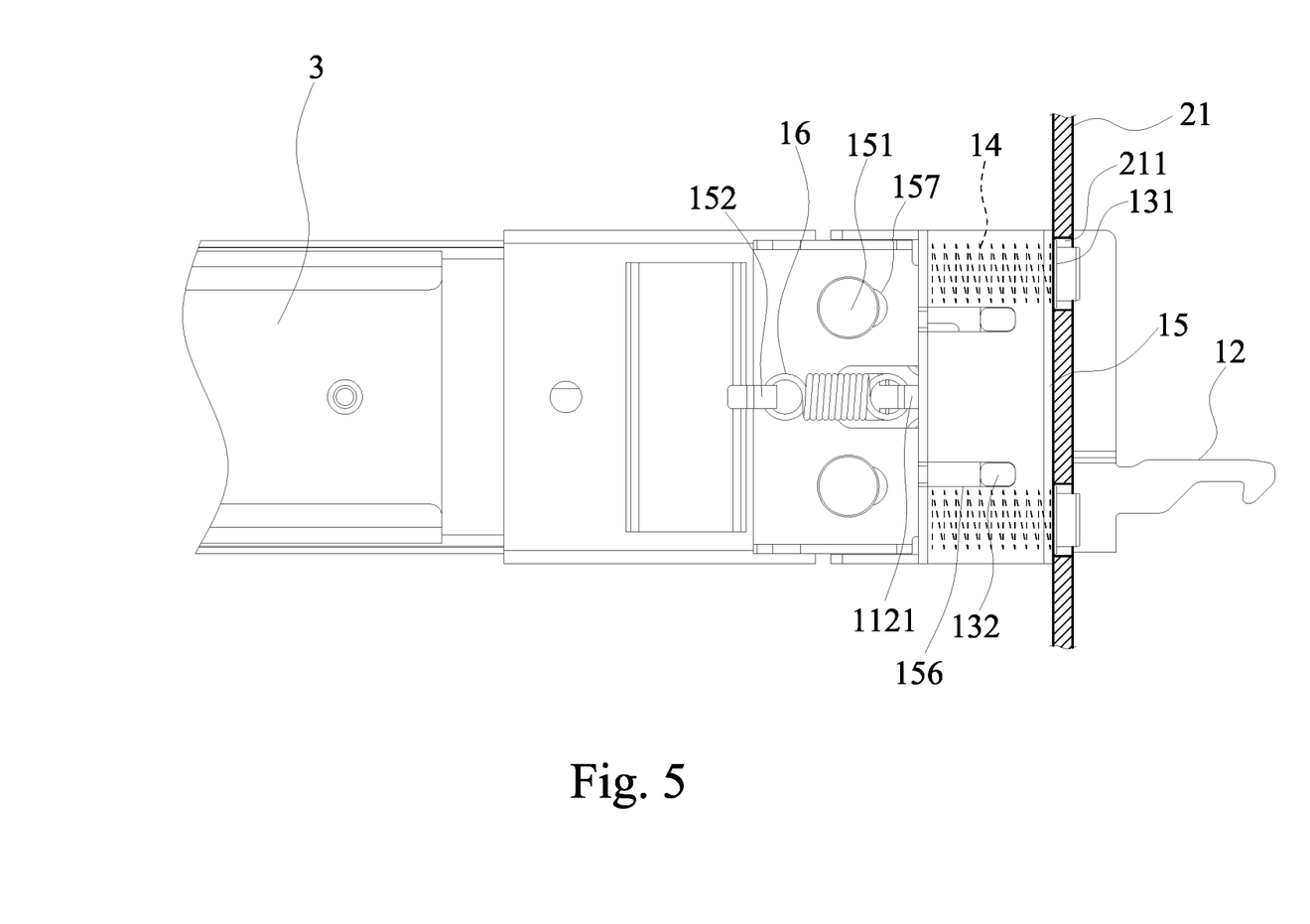
FIG. 5 is a second schematic view showing an operating status of a preferred embodiment of this disclosure.
Figure 6:
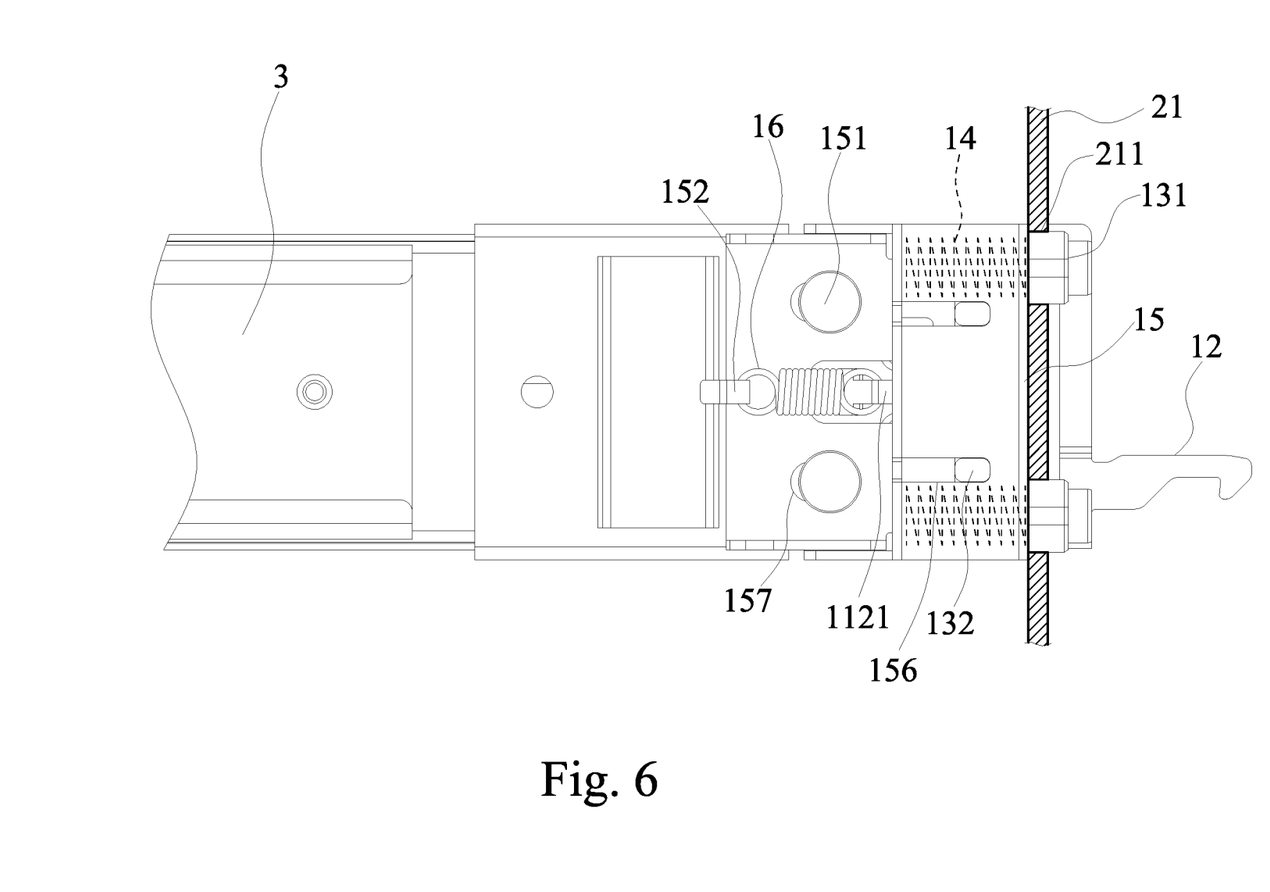
FIG. 6 is a third schematic view showing an operating status of a preferred embodiment of this disclosure.
Figure 7:
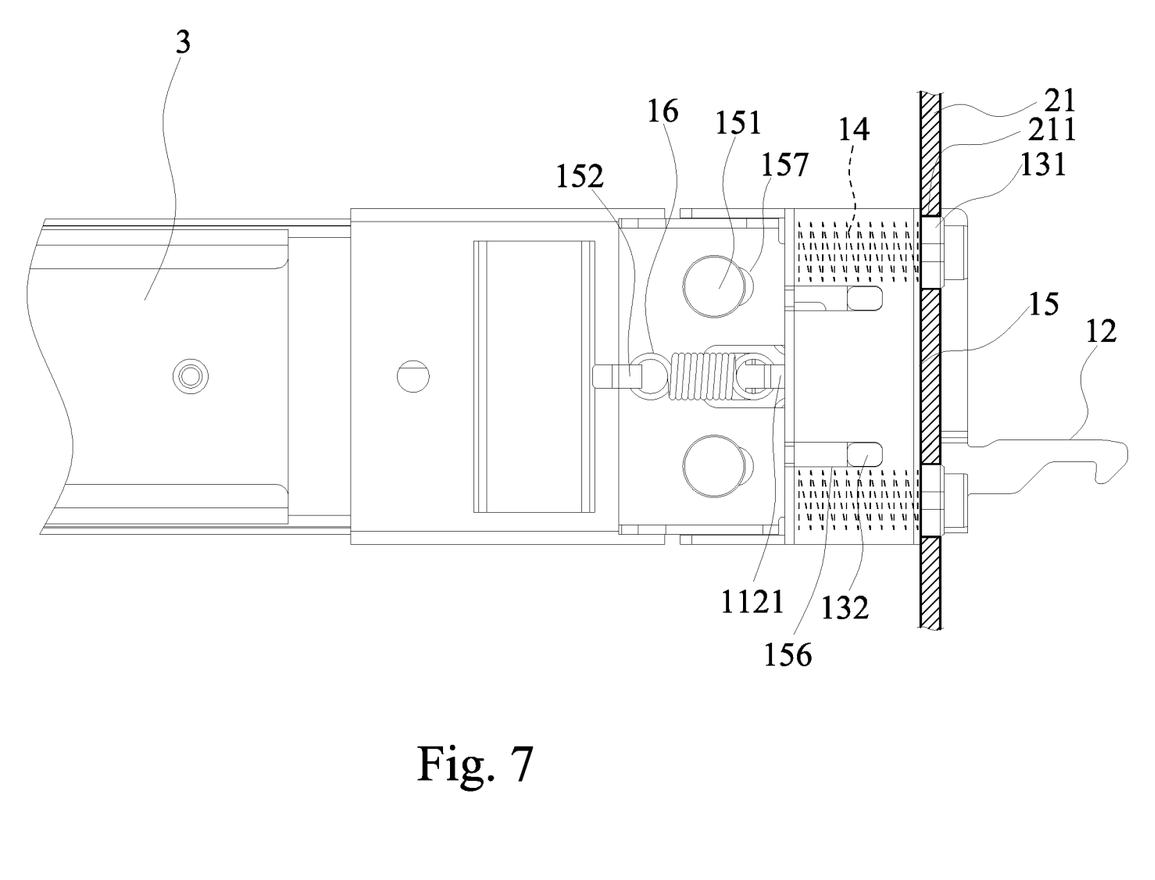
FIG. 7 is a fourth schematic view showing an operating status of a preferred embodiment of this disclosure.

The fixed seat 11 has a first receiving slot 111 formed on a side of the fixed seat 11 and configured to be corresponsive to the slide rail 3, a second receiving slot 112 formed on the other side of the fixed seat 11, a stop plate 113 disposed on a side of the second receiving slot 112 and configured to be corresponsive to the chassis 21, two through holes 1131 formed on the stop plate 113 and arranged apart from each other, and a first fixing hook 1121 disposed in the second receiving slot 112.

The engaging plate 12 has a section fixed to the reverse side of the fixed seat 11 and configured to be opposite to the second receiving slot 112, a hook 121 extending outwardly from the other section of the engaging plate 12, and an engaging slot 122 formed on a surface of the outwardly extended section and configured to be corresponsive to the stop plate 113. In addition, two fixing holes 1122 are formed at the centers of the second receiving slots 112 respectively for fixing the engaging plate 12 to the other side of the fixed seat 11.

The chassis fixing block 13 is movably installed into the second receiving slot 112, and the chassis fixing block 13 has two bumps 131 configured to be corresponsive to the pair through holes 1131 and provided for passing and fixing into any two of the buckle holes 211 of the chassis 21 respectively. In addition, each bump 131 formed at the front end of the chassis fixing block 13 is in the shape of the buckle hole 211 and designed with a two-stage structure in form of a rectangular shape combined with a cylindrical shape, and provided for being used to fix the buckle hole 211 which is in a circular or square shape.

An end of the pair of first elastic elements 14 is disposed on a side of the chassis fixing block 13, so that the two bumps 131 can pass out from the two through holes 1131.

A side of the fixing block cover 15 is movably installed into the second receiving slot 112 through a pair of pivots 151, and the fixing block cover 15 is provided for covering the chassis fixing block 13 and the two first elastic elements 14, so that the chassis fixing block 13 can limit a linear movement inside the fixing block cover 15. In addition, the fixing block cover 15 has a second fixing hook 152 disposed at an edge opposite to a side of the pair of pivots 151. It is noteworthy that a positioning hole 1132 is formed at the center of the stop plate 113 and a positioning protrusion 153 is disposed on the fixing block cover 15 and configured to be corresponsive to the positioning hole 1132, and the positioning hole 1132 is disposed between the two through holes 1131 to facilitate the assembling. After installation, the positioning protrusion 153 is disposed in the positioning hole 1132, and the fixing block cover 15 has a pair of mounting columns 154 configured to be corresponsive to the pair of first elastic elements 14 respectively for sheathing an end of each of the first elastic elements 14 on each of the mounting columns 154. In FIG. 3, to reduce the vibration produced during the movement of the chassis fixing block 13, the fixing block cover 15 has two press plates 155 configured to be corresponsive to the chassis fixing block 13. In FIG. 1, a pair of limit blocks 132 are disposed apart from each other on the top of the chassis fixing block 13 directly, and the fixing block cover 15 has a pair of first limit grooves 156 formed on a surface thereof and configured to be corresponsive to the pair of limit blocks 132 respectively. During installation, the pair of limit blocks 132 are respectively and movably installed in the pair of first limit grooves 156. To avoid the vibration issue during the movement of the fixing block cover 15, this disclosure specially designs two second limit grooves 157 formed on the fixing block cover 15 and configured to be corresponsive to the pair of pivots 151, so that after the pair of pivots 151 pass into the two second limit grooves 157 respectively, the fixing block cover 15 is in a movement limit mode with respect to the fixed seat 11.

Both ends of the second elastic element 16 are disposed between the first fixing hook 1121 and the second fixing hook 152 to ensure that the fixing block cover 15 can abut against the chassis 21.

During installation, the engaging slot 122 of the engaging plate 12 is provided for engaging the front side of the chassis 21, and the second elastic element 16 is provided for maintaining the fixing block cover 15 to abut against the reverse side of the chassis 21, and after the chassis fixing block 13 is pushed by the first elastic element 14 to pass into the corresponding buckle holes 211 of the chassis 21, the slide rail 3 is fixed between the two chassis 21.

What is claimed is:

1. An elastic clamping fastener module of an industrial cabinet rail, wherein a chassis is disposed at each of four corners of the industrial cabinet, and each vertically erected chassis has a plurality of buckle holes disposed apart from each other, and the elastic clamping fastener module is installed at a front end of a slide rail, configured to be opposite to the industrial cabinet, and provided for installing the slide rail horizontally between two chassis, and the elastic clamping fastener module comprises:
    a fixed seat, having a first receiving slot formed on a side of the fixed seat and configured to be corresponsive to the slide rail, a second receiving slot formed on the other side of the fixed seat, a stop plate disposed on a side of the second receiving slot and configured to be corresponsive to the chassis, two through holes formed on the stop plate and arranged side by side with an interval apart from each other, and a first fixing hook disposed in the second receiving slot;
    an engaging plate, having a section fixed to a reverse side of the fixed seat and configured to be opposite to the second receiving slot, a hook extending outwardly from an another side of the engaging plate, and an engaging slot formed on a surface of the outwardly extended section and configured to be corresponsive to the stop plate;
    a chassis fixing block, movably installed into the second receiving slot, and having two bumps formed on the chassis fixing block and configured to be corresponsive to a pair of through holes for passing and fixing into any two of the plurality of buckle holes of the chassis respectively;
    a pair of first elastic elements, with an end disposed on a side of the chassis fixing block, such that the two bumps pass through the two through holes respectively;
    a fixing block cover, with a side movably installed into the second receiving slot through a pair of pivots, and the fixing block cover being provided for covering the chassis fixing block and the pair of first elastic elements, so that the chassis fixing block can restrict a linear movement inside the fixing block cover, and the fixing block cover having a second fixing hook disposed at an edge of the fixing block cover and configured to be opposite to the pair of pivots; and
    a second elastic element, with both ends disposed between the first fixing hook and the second fixing hook, for ensuring that the fixing block cover abuts against the chassis;
    thereby, during installation, the engaging slot of the engaging plate is used for engaging by a front side of the chassis, and then the second elastic element is used to keep the fixing block cover abutting a reverse side of the chassis, and the chassis fixing block is pushed by the first elastic element to pass into the buckle holes corresponding to the chassis, and then the slide rail is fixed between two chassis.

2. The elastic clamping fastener module of an industrial cabinet rail according to claim 1, wherein the fixing block cover has two press plates corresponding to the chassis fixing block for reducing vibration produced by a movement of the chassis fixing block.

3. The elastic clamping fastener module of an industrial cabinet rail according to claim 1, wherein the chassis fixing block has a pair of limit blocks disposed with an interval apart on a top of the chassis fixing block, and a pair of first limit grooves formed on a surface of the fixing block cover corresponding to the pair of limit blocks, and during installation, the pair of limit blocks are respectively and movably installed in the pair of first limit grooves.

4. The elastic clamping fastener module of an industrial cabinet rail according to claim 1, wherein each bump at a front end of the chassis fixing block is in a shape corresponding to that of the buckle hole and designed with a two-stage structure in form of a rectangular shape combined with a cylindrical shape, and provided for corresponding to a design of fixing the buckle hole which is in a circular shape or a square shape.

5. The elastic clamping fastener module of an industrial cabinet rail according to claim 1, wherein the fixing block cover has two second limit grooves configured to be corresponsive to the pair of pivots respectively, so that after the pair of pivots pass through the two second limit grooves respectively, the fixing block cover is also in a movement limit mode.

6. The elastic clamping fastener module of an industrial cabinet rail according to claim 1, wherein the second receiving slots have two fixing holes formed at a center thereof respectively and provided for fixing the engaging plate to the other side of the fixed seat.

7. The elastic clamping fastener module of an industrial cabinet rail according to claim 1, wherein the stop plate has a positioning hole formed at a center thereof, and the fixing block cover has a positioning protrusion configured to be corresponsive to the positioning hole and the positioning hole is disposed between the two through holes, and after installation, the positioning protrusion is disposed in the positioning hole.

8. The elastic clamping fastener module of an industrial cabinet rail according to claim 1, wherein the fixing block cover has a pair of mounting columns configured to be corresponsive to the pair of first elastic elements and provided for sheathing an end of each of the first elastic elements on each of the mounting columns respectively.

* * * * *